United States Patent
Strachan et al.

(10) Patent No.: US 11,544,540 B2
(45) Date of Patent: Jan. 3, 2023

(54) SYSTEMS AND METHODS FOR NEURAL NETWORK TRAINING AND DEPLOYMENT FOR HARDWARE ACCELERATORS

(71) Applicant: Hewlett Packard Enterprise Development LP, Houston, TX (US)

(72) Inventors: John Paul Strachan, Palo Alto, CA (US); Sergey Serebryakov, San Jose, CA (US)

(73) Assignee: Hewlett Packard Enterprise Development LP, Spring, TX (US)

(*) Notice: Subject to any disclaimer, the term of this patent is extended or adjusted under 35 U.S.C. 154(b) by 723 days.

(21) Appl. No.: 16/409,729

(22) Filed: May 10, 2019

(65) Prior Publication Data
US 2020/0356843 A1 Nov. 12, 2020

(51) Int. Cl.
*G06N 3/08* (2006.01)
*G11C 7/10* (2006.01)
*G06N 3/063* (2006.01)
*G06F 17/16* (2006.01)
*G06N 3/04* (2006.01)

(52) U.S. Cl.
CPC ......... *G06N 3/063* (2013.01); *G06F 17/16* (2013.01); *G06N 3/04* (2013.01); *G06N 3/08* (2013.01); *G11C 7/1012* (2013.01)

(58) Field of Classification Search
None
See application file for complete search history.

(56) References Cited

U.S. PATENT DOCUMENTS 10,340,002 B1 * 7/2019 Kim ............... G11C 13/0038
2014/0289445 A1 9/2014 Savich
(Continued)

OTHER PUBLICATIONS

Caiwen Ding et al., "CIRCNN: Accelerating and Compressing Deep Neural Networks using Block-Circulant Weight Matrices," Aug. 29, 2017, pp. 1-29, Retrieved from the Internet on Feb. 5, 2019 at URL: <groundai.com/project/circnn-accelerating-and-compressing-deep-neural-networks-using-block-circulantweight-matrices/>.
(Continued)

*Primary Examiner* — Joni Hsu
(74) *Attorney, Agent, or Firm* — Sheppard Mullin Richter & Hampton LLP

(57) ABSTRACT

Systems and methods are provided for implementing hardware optimization for a hardware accelerator. The hardware accelerator emulates a neural network. Training of the neural network integrates a regularized pruning technique to systematically reduce a number of weights. A crossbar array included in hardware accelerator can be programmed to calculate node values of the pruned neural network to selectively reduce the number of weight column lines in the crossbar array. During deployment, the hardware accelerator can be programmed to power off periphery circuit elements that correspond to a pruned weight column line to optimize the hardware accelerator for power. Alternatively, before deployment, the hardware accelerator can be optimized for area by including a finite number of weight column line. Then, regularized pruning of the neural network selectively reduces the number of weights for consistency with the finite number of weight columns lines in the hardware accelerator.

11 Claims, 7 Drawing Sheets

(56) References Cited

U.S. PATENT DOCUMENTS

| | | | |
|---|---|---|---|
| 2017/0308789 A1 | 10/2017 | Langford et al. | |
| 2018/0114569 A1* | 4/2018 | Strachan | G11C 11/54 |
| 2019/0041961 A1* | 2/2019 | Desai | G06N 3/08 |
| 2019/0147329 A1* | 5/2019 | Hekmatshoartabari | G06N 3/0635 |
| | | | 706/26 |
| 2019/0347555 A1* | 11/2019 | Park | G06N 3/082 |

OTHER PUBLICATIONS

Chetan Singh Thakur et al., "Large-scale Neuromorphic Spiking Array Processors: A Quest to Mimic the Brain," May 23, 2018, pp. 1-55.

Li Du and Yuan Du, "Chapter 1: Hardware Accelerator Design for Machine Learning," 2018, pp. 1-14, Sep. 2018.

Yuxin Zhang et al., "Three Dimensional Convolutional Neural Network Pruning with Regularization-based Method," 2018, pp. 1-4, Zhejiang University, Nov. 2018.

* cited by examiner

SYSTEMS AND METHODS FOR NEURAL NETWORK TRAINING AND DEPLOYMENT FOR HARDWARE ACCELERATORS

DESCRIPTION OF RELATED ART

Artificial neural networks are a family of technical models based on biological nervous systems, which are used to estimate or approximate functions that depend on a large number of inputs. Neural networks may be represented as a system of interconnected "neurons" which exchange messages between each other. The connections may have numerical weights that can be tuned based on experience, making neural networks adaptive to inputs and capable of machine learning. Artificial neural networks may have a variety of applications, including function approximation, classification, data processing, robotics, and computer numerical control.

There may be various types of neural networks, including feedforward neural networks, radial basis function neural networks, recurrent neural networks, and other types. As a general description, Hopfield Neural Networks (HNNs) are a type of artificial neural network that involve computed iterative steps based on energy minimizing rules. The recurrent, or feedback characteristics of HNNs may be particularly suitable for implementing logic operations, solving optimization problems, performing analog-digital conversion, and implementing associative memories (e.g., content-addressable memories), for example. However, in some cases, implementations of neural networks, such as HNNs, experience limitations due to various related computational properties of. For instance, HNN computations including matrix operations may bottleneck (e.g., ~90%) as the size of the neural network grows. There are techniques in the realm of neural networks that can be applied to address this concern, such as a neural network "pruning" approach. As a general description, neural network pruning endeavors to reduce the size of the neural network. Nonetheless, many hardware accelerators for matrix operations do not benefit from existing neural network pruning, as the pruning may randomly and indiscriminately remove synaptic weights.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Various embodiments described herein are directed to hardware circuitry that is configured to emulate a logical neural network. Furthermore, the hardware can be adapted to include dedicated circuitry, namely a memristor crossbar array, that is designed for integrating regularized pruning into the emulated neural network for optimized performance.

Memristors are devices that may be used as components in a wide range of electronic circuits, such as memories, switches, radio frequency circuits, and logic circuits and systems. In a memory structure, a crossbar array of memory devices having memristors may be used. In memory devices, memristors may be used to store bits of information, 1 or 0. The resistance of a memristor may be changed by applying an electrical stimulus, such as a voltage or a current, through the memristor. Generally, at least one channel may be formed that is capable of being switched between two states—one in which the channel forms an electrically conductive path ("on") and one in which the channel forms a less conductive path ("off"). In some other cases, conductive paths represent "off" and less conductive paths represent "on". Furthermore, memristors may also behave as an analog component with variable conductance.

In some applications, a memory crossbar array can be used to perform vector-matrix computations. For example, an input voltage signal from each row line of the crossbar is weighted by the conductance of the resistive devices in each column line and accumulated as the current output from each column line. Ideally, if wire resistances can be ignored, the current (I) flowing out of the crossbar array will be approximately represented in the equation below:

$$I^T = V^T G \qquad (1)$$

where V is the input voltage and G is the conductance matrix.

The memristor crossbar array is configured to include contributions from each memristor in the crossbar array. The use of memristors at junctions or cross-points of the crossbar array enables programming the resistance (or conductance) at each such junction.

Examples disclosed herein include hardware accelerators for calculating node values for neural networks. Example hardware accelerators may include a memristor crossbar array programmed to calculate node values. Memory cells of the memristor crossbar array may be programmed according to a weight matrix. Driving input voltages mapped from an input vector through the memristor crossbar array may produce output current values which may be compared to a threshold current to generate a new input vector of new node values. In this manner, example accelerators herein provide for hardware calculations of node values for neural networks.

Figure 1A:
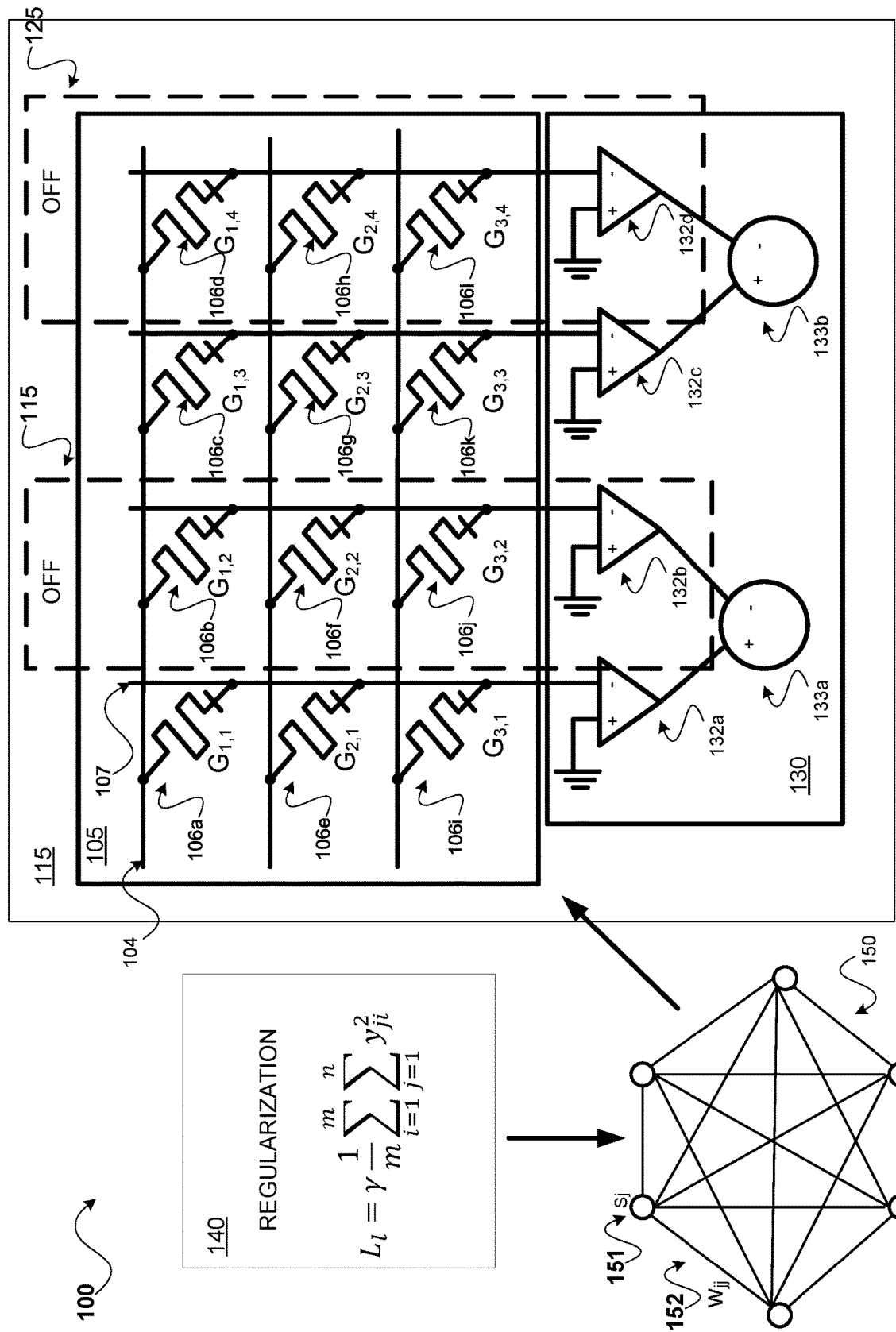
FIGS. 1A-1B depict conceptual diagrams of an example technique for adapting a hardware accelerator system during hardware deployment, and including a memristor crossbar array that implements a neural network trained using regularized pruning techniques, according to some embodiments.
Figure 1B:
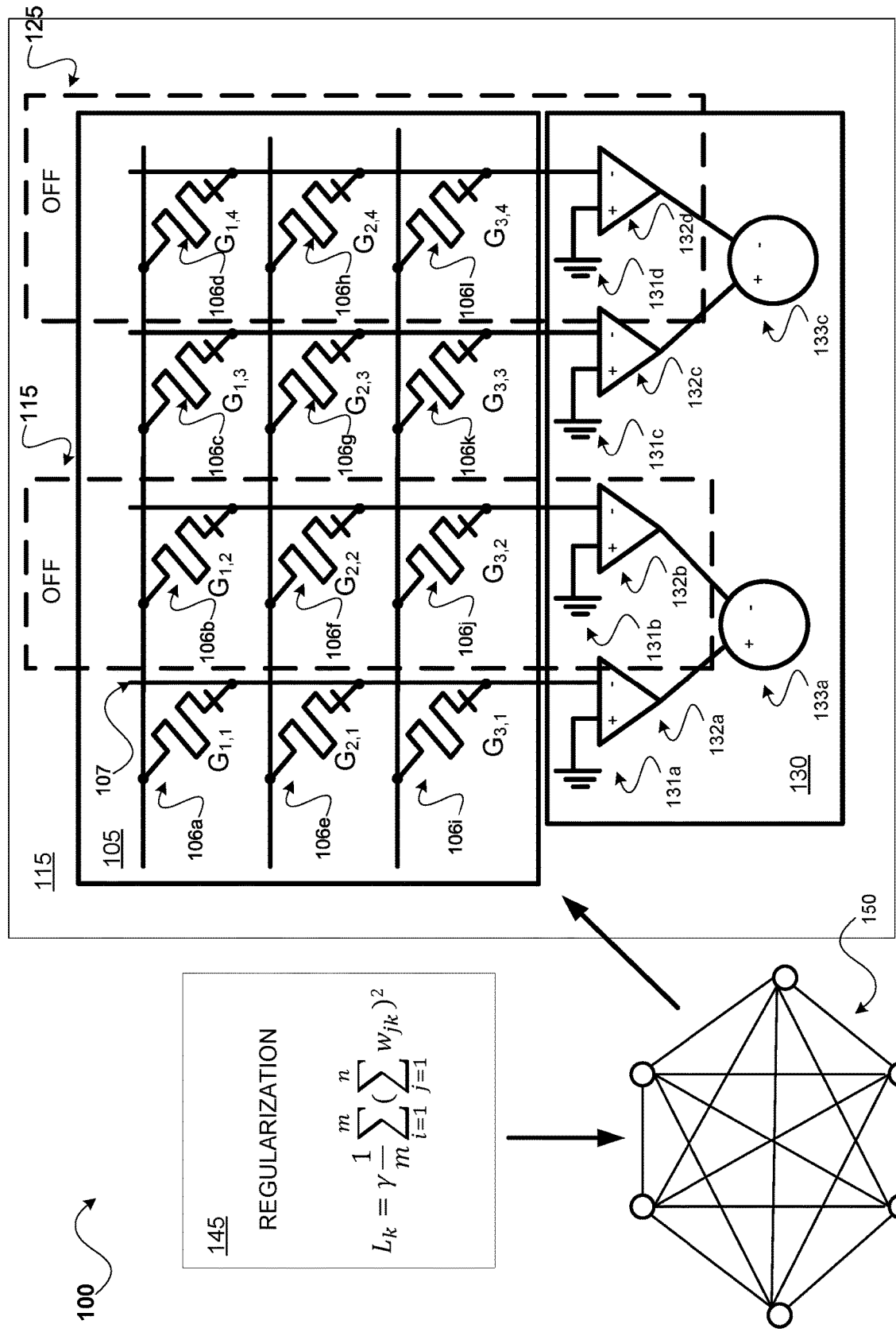
Figure 2A:
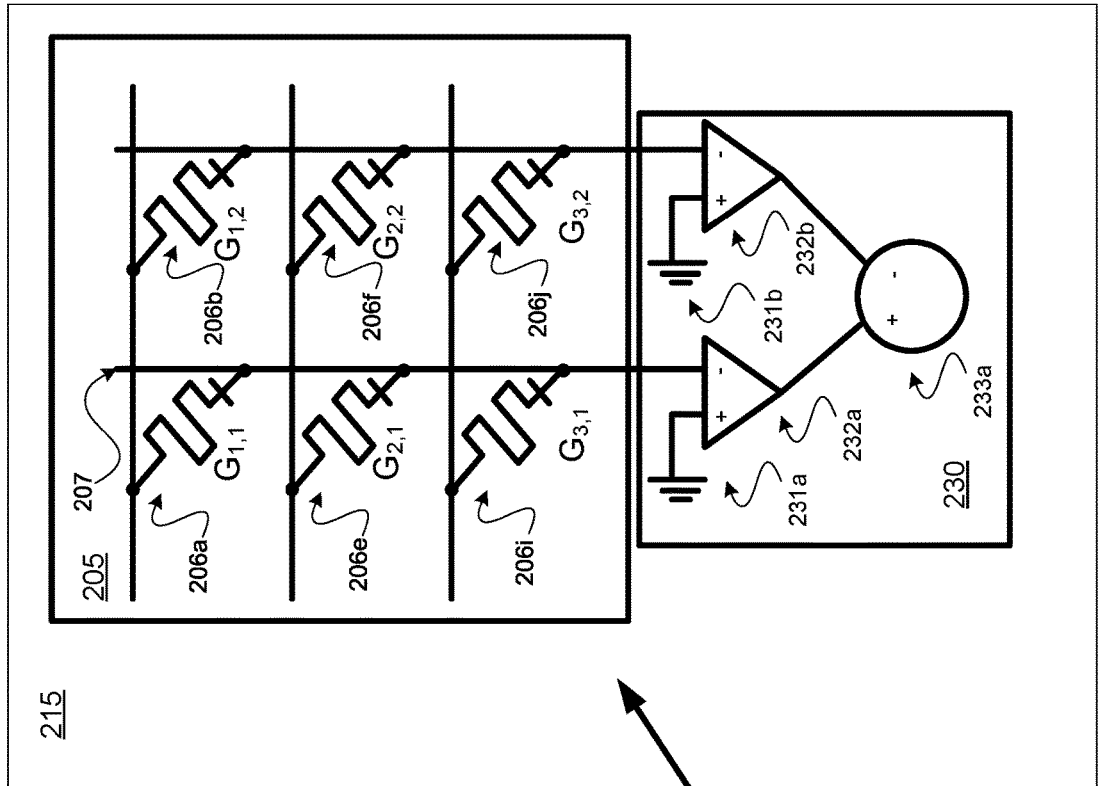
FIGS. 2A-2B depict conceptual diagrams of an example technique for implementing a hardware accelerator system that has been adapted prior to hardware deployment, and including a memristor crossbar array that implements a neural network trained using regularized pruning techniques, according to some embodiments.
Figure 2A:
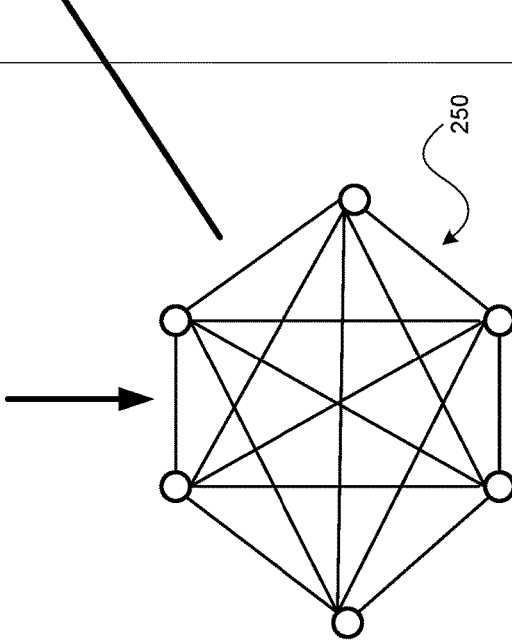
Figure 2B:
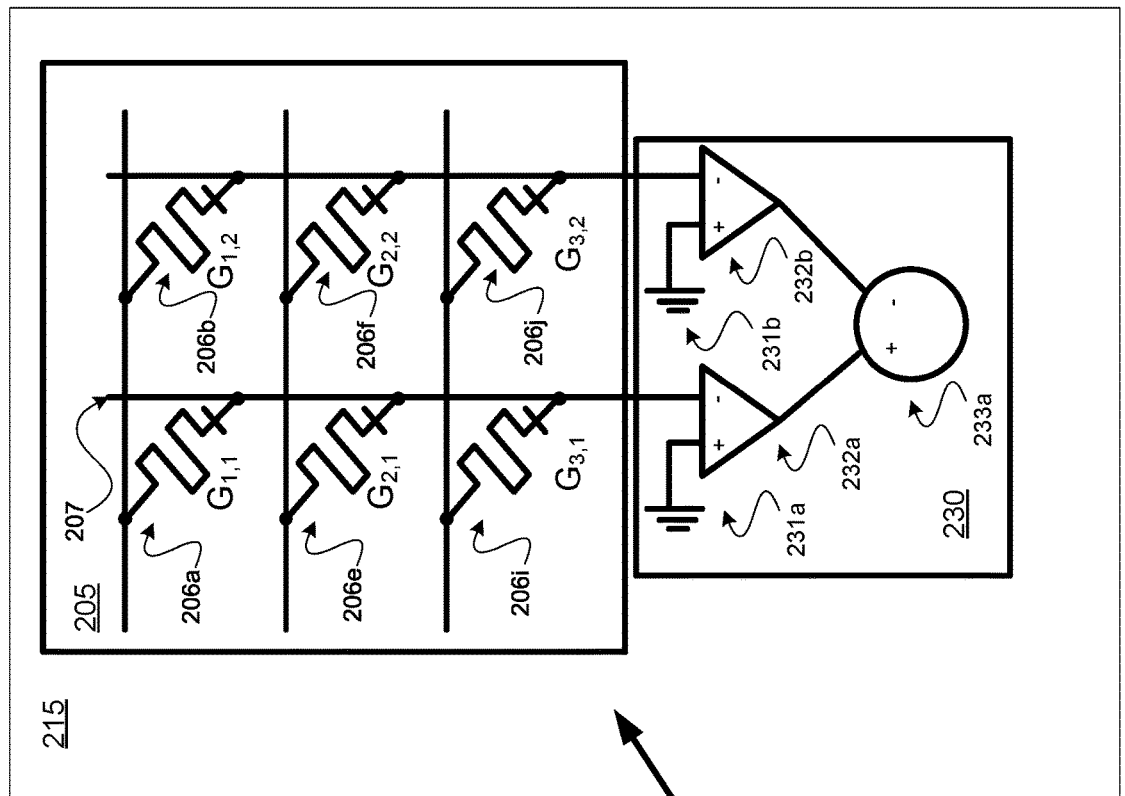
Figure 2B:
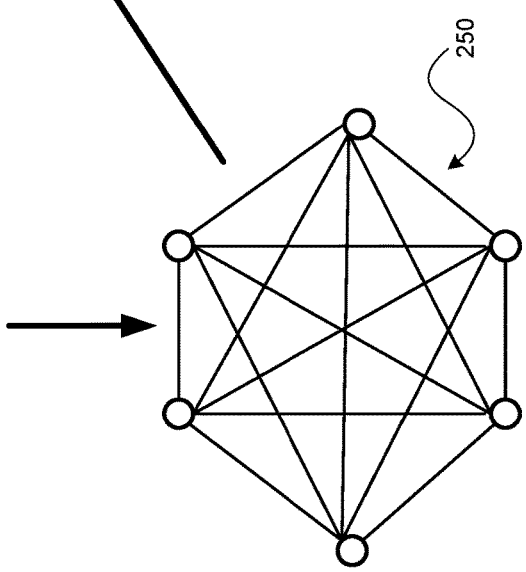

Referring now to the drawings, FIGS. 1A-1B and FIGS. 2A-2B depict conceptual diagrams of optimization processes for realizing multiple improvements to the hardware architecture of the hardware accelerator 115. The processes can achieve optimization of a hardware emulated neural network by applying a neural network pruning approach that is regularized (hereinafter referred to as regularized pruning) to the design, as disclosed herein. As a general description, the optimization processes can be described as including two principal approaches: 1) applying regularized pruning during training of the neural network, and accordingly adapting the hardware accelerator after hardware deployment to emulate the pruned neural network; and 2) applying regularized pruning during training of the neural network, and accordingly emulating the pruned neural network with a hardware accelerator that has been adapted (e.g., reduced circuitry anticipating pruning) prior to hardware deployment. Specifically, FIGS. 1A-1B serve to conceptually illustrate the first approach, namely process 100, which adapts the hardware accelerator during deployment. FIGS. 2A-2B serve to conceptually illustrate the second approach, namely process 200, where the hardware accelerator has been adapted prior to hardware deployment.

As alluded to above, neural network pruning is an approach that is typically used to reduce the size of the neural network (e.g., smaller number of nodes and/or matrices). However, many hardware accelerators that are configured to perform matrix operations, such as hardware accelerator 115, may not benefit from these conventional neural network pruning approaches. That is, performing a "prune" of the neural network by randomly and indiscriminately removing synaptic weights does not take into consideration that the presence of some analog crossbars may be valuable to the hardware design (in order for the circuitry to perform the needed matrix operations). For instance, a hardware accelerator having a dense matrix implementation may lead to a more robust and power-efficient design, with regard to solving complex optimization problems. Particularly in the case of HNNs, it may be desirable for the hardware implementation to emulate fully-connectivity, where each node is connected to each of the remaining nodes in the network, for its computations. The hardware designed for a fully-connected HNN can require a comparatively large crossbar array. Attempting to optimize the larger crossbar array by randomly eliminating the synaptic weights, in the manner of some existing pruning methods, may negatively impact the performance and computational power of the emulated HNN (e.g., breaking the full-connectivity). Furthermore, a hardware accelerator including a larger crossbar array typically has the capacity to perform more computations in parallel, than those with a small crossbar array implementation. In order to address these concerns, the disclosed optimization techniques attempt to reach a nexus between the design trade-offs of pruning the NN (e.g., reduced circuit area consumption), and the advantages associated with larger crossbar arrays.

FIG. 1A illustrates an example of a hardware accelerator 115 according to the embodiments. Hardware accelerator 115 may be a hardware unit configured for calculating node values for neural networks. Hardware accelerator 115 may calculate new node values of a neural network by transforming an input vector in relation to a weight matrix. Hardware accelerator 115 may do so by calculating a vector-matrix multiplication of the input vector with the weight matrix.

In the example illustrated in FIG. 1A, a Hopfield Neural Network (HNN) 150 is particularly implemented by the hardware accelerator 115 described herein. As previously described, HNNs are a type of artificial neural network that are often used for solving optimized problems. Some practical examples where HNNS can be utilize include solving NP-hard problems in scheduling and resource allocation. By emulating a HNN 150, the hardware accelerator 115 is capable of solving quadratic optimization problems, for example, using analog crossbars to perform the matrix operations. FIG. 1A shows an implementation of the example hardware accelerator 115 having various components, including: a memristor crossbar array structure 105; and peripheral circuitry 130. Memristor crossbar array 105 can be configured to implement the weight matrix aspects of the HNN, as described above.

A model of an HNN 150 is conceptually illustrated in FIG. 1A. Graphically, an HNN 150 (as a mathematical construct) can be represented as graph of a bidirectional (undirected) network with nodes ($s_i$) 151 and edges ($w_{ij}$) 152. Edges 152 can be formed between each of the nodes 151. A computational "problem" can be encoded (or trained) in the edge weights and a threshold function. Input node values can be delivered to the nodes 151 until the computational "answer" to the problem is determined by a final state for the node values. In this manner, an HNN 150 can be a dynamic system, and the values of the nodes 151 can evolve based on the edge 152 weightings to all the other node values (e.g., as a dot product operation). The final configuration of the nodes 151 encodes the solution. The HNN 150 can be "trained" to a set of distinct inputs. Neural network pruning can be applied during the training of the neural network. In general, existing pruning approaches can involve removing random weights, and then re-training the neural network with the reduced number of weights. Pruning a neural network using convention techniques, while characteristically random, can provide the benefit of reducing the size of the network (~2-10 time smaller), while yielding little (or no) loss in the network's accuracy. Nonetheless, as described above, many hardware approaches have little benefit from some of the existing tuning methods, as dense matrices are relatively inexpensive, but contribute to the computational power of the emulated neural network. For instance, in the example of the hardware accelerator 115, the power and area consumption of the circuitry is not dominated by the area associated with the crossbar array 105. Rather, the area and power of the circuitry of the hardware accelerator 115 is by and large dedicated for to peripheral circuitry 130. As seen in FIG. 1A, the peripheral circuitry 130 can include current sensing amplifiers (amps) 132a-132d, and analog-to-digital (ADC) converters 133a-133b. In some cases, these aforementioned electrical components particularly dominate the power and area consumption of the circuit.

As discussed above, the disclosed optimization technique applies a pruning approach that, unlike the aforementioned conventional approaches, is regularized though employing regularization function 140. Thus, the regularized pruning aspects disclosed herein may realize an improvement over traditional neural network pruning, by eliminating synaptic weights from the neural network in a systematic manner (as opposed to randomly pruning). Regularization, as referred to herein, can be generally described as a technique which injects slight modifications to the learning algorithm such that the model generalizes better. This convergence towards generalization (e.g., less overfitting), in turn, can improve the model's overall performance. By integrating the regularization function 150 into training the HNN 150, the approach lends itself to a column-at-a-time elimination (or inclusion). The regularization function 140 has been particularly tuned such that pruning the HNN 150 is customized to favor removing an entire column, which is be better suited to the particular hardware implementation of the HNN 150

(e.g., columnized crossbar arrays). According to some embodiments, the regularization function 140 is implements L1 and L2 type regularization for neural networks, such as HNN 150. L1/L2 regularization can update a general cost function associated with a neural network by adding a regularization term. Due to the addition of the regularization term, the values of weight matrices can decrease, because it assumes that a neural network with smaller weight matrices lead to a less complex model. The regularization function 140 is configured to result in turning "off" a particular column (e.g., neuron), that is not application for output layers. In the case of L1/L2 implementation, large outputs of neurons should result in weight decay. For example, the regularization function 140 used by the optimization technique 100 in FIG. 1A includes a loss term (for the l-th layer a neural network) the may be represented as the equation below:

$$L_l = \gamma \frac{1}{m} \Sigma_{i=1}^{m} \Sigma_{j=1}^{n} y_{ji}^2 \qquad (2)$$

where $L_l$ is the loss term associated with the l-th layer;

γ is the weighting factor specifying the contribution of this loss term to the total loss, it can be used to find balance between accuracy and number of neurons that do not propagate signal;

m is the number of examples in a mini-batch;

n is the number of neurons (columns);

$y_j$ is the output of the j-th neuron (column);

$y_{ji}$ is the output j-th neuron in the i-th minibatch.

Accordingly, applying regularization function 140 to direct the training of HNN 150 results in a pruned network. Then, the process 100 can involve constructing a hardware implementation of the pruned HNN 150. In the example of FIG. 1A, the optimization technique 100 can be applied in constructing the hardware accelerator 115, which can be implemented as an Application Specific Integrated Circuit (ASIC). In some examples, the hardware accelerator 115 can be fabricated using semiconductor processing techniques using an integrated structure or semiconductor die. During hardware deployment, the circuitry of hardware accelerator 115 can be constructed such that selected columns are powered off and/or re-routed to multiplexed column sensing circuits. Restated, the regularized pruning accomplished by regularization function 140 can prune, or otherwise remove, columns associated with synaptic weights in the model of HNN 150.

In the hardware accelerator 115, the channels formed therein (also referred to as lines) are capable of being switched between two states—"on" and "off". As such, each pruned synaptic weight can be emulated in the hardware by switching "off" the corresponding channel for an entire column in the hardware accelerator 115. This can also be referred to as power "off" of the channel and/or the memristors along the column for the channel in the memristor crossbar array. An "off" column line may be made to be less conductive, such that an electrical signal, for example current flow or voltage, is not propagated through that column line. Therefore, a pruned column of the memristor crossbar array in a manner that provides power to the memristors or peripheral circuits. As a result, the embodiments provide an efficient and hardware-driven solution, which realizes power and area savings in hardware emulated HNNs in a manner that is an improvement over traditional pruning. It should be understood that although the hardware optimization processes disclosed herein are described with respect to HNNs for purposes of discussion, that the embodiments are not intended to be limited to HNNs. The hardware optimization techniques, and other aspects of the embodiments, can be applied to various other hardware implementations.

Referring back to FIG. 1A, hardware accelerator 115 can include memristor crossbar array 105. Memristor crossbar array 105 can be a configuration of parallel and perpendicular lines with memory cells coupled between lines at intersections. Memristor crossbar array 105 may include a plurality of row lines 104, a plurality of column lines 107, and a plurality of memory cells 106a-106l. Each of the memory cells 106a-106l may be coupled between each unique combination of one row line 104 and one column line 107. In other words, none of the memory cells 106a-106l share both a row line 104 and a column line 107.

Row lines 104 may be electrodes that carry current through memristor crossbar array 105. In some examples, row lines 104 may be parallel to each other, generally with equal spacing. Row lines 104 may sometimes be, for example, a top electrode or a word line. Similarly, column lines 106 may be electrodes that run nonparallel to row lines 104. Column lines 107 may sometimes be, for example, a bottom electrode or bit line. Row lines 104 and column lines 107 may serve as electrodes that deliver voltage and current to the memory cells 106a-106l. Example materials for row lines 104 and column lines 107 may include conducting materials such as Pt, Ta, Hf, Zr, Al, Co, Ni, Fe, Nb, Mo, W, Cu, Ti, TiN, TaN, Ta$_2$N, WN$_2$, NbN, MoN, TiSi$_2$, TiSi, TiSi$_3$, TaSi$_2$, WSi$_2$, NbSi$_2$, V$_3$Si, electrically doped polycrystalline Si, electrically doped polycrystalline Ge, and combinations thereof. In the example of FIG. 1A, memristor crossbar array 105 may have N row lines and M column lines.

Memory cells 106a-106l may be coupled between row lines 104 and column lines 107 at intersections of the row lines 104 and column lines 107. For example, memory cells 106A-106l may be positioned to calculate a new node value of an input vector of node values with respect to a weight matrix. Each of the memory cells 106a-106l may have a memory device such as a resistive memory element, a capacitive memory element, or some other form of memory.

In some examples, each of the memory cells 106A-106l may include a resistive memory element. A resistive memory element may have a resistance that changes with an applied voltage or current. Furthermore, in some examples, the resistive memory element may "memorize" its last resistance, either in a volatile or a non-volatile way. In this manner, each resistive memory element may be set to at least two states. In many examples, a resistive memory element may be set to multiple resistance states, which may facilitate various analog operations. The resistive memory element may accomplish these properties by having a memristor, which may be a two-terminal electrical component that provides memristive properties as described herein.

In some examples, a memristor may be nitride-based, meaning that at least a portion of the memristor is formed from a nitride-containing composition. A memristor may also be oxide-based, meaning that at least a portion of the memristor is formed from an oxide-containing material. Furthermore, a memristor may be oxy-nitride based, meaning that at least a portion of the memristor is formed from an oxide-containing material and that at least a portion of the memristor is formed from a nitride-containing material. Example materials of memristors may include tantalum oxide, hafnium oxide, titanium oxide, yttrium oxide, niobium oxide, zirconium oxide, or other like oxides, or nontransition metal oxides, such as aluminum oxide, calcium oxide, magnesium oxide, dysprosium oxide, lanthanum oxide, silicon dioxide, or other like oxides. Further examples include nitrides, such as aluminum nitride, gallium nitride, tantalum nitride, silicon nitride, and oxynitrides such as silicon oxynitride. In addition, other functioning memristors may be employed in the practice of the teachings herein.

A memristor may exhibit nonlinear or linear current-voltage behavior. Nonlinear may describe a function that grows differently than a linear function. In some implementations, a memristor may be linear or nonlinear in voltage ranges of interest. A voltage range of interest may be, for example, a range of voltages used in the operation of hardware accelerator 100. In some examples, memory cells 106a-106l may include other components, such as access transistors or selectors. For example, each of the memory cells 106A-106l may be coupled to an access transistor between the intersections of a row line 104 and a column line 106. Access transistors may facilitate the targeting of individual or groups of memory cells 106A-106l for the purposes of reading or writing the memory cells.

Alternatively, a selector may be an electrical device that may be used in memristor devices to provide desirable electrical properties. For example, a selector may be a 2-terminal device or circuit element that admits a current that depends on the voltage applied across the terminals. A selector may be coupled to each of the memory cells 106a-106l to facilitate the targeting of individual or groups of memory cells 106a-106l. For example, a selector may do so by acting like an on-off switch, and it may mitigate sneak current disturbance.

The memory cells 106a-106l of memristor crossbar array 105 may be programmed according to a weight matrix of a neural network. A weight matrix may represent a compilation of operations of a neural network. For example, a weight matrix may represent the weighted edges of HNN 150. The value stored in the memory cells 106a-106l may represent the values of a weight matrix. In implementations of resistive memory, the resistance levels of each of the memory cells 106a-106l may represent a value of the weight matrix. In such a manner, the weight matrix may be mapped onto crossbar array 105.

Memory cells 106a-106l may be programmed, for example, by having programming signals driven through them, which drives a change in the state of the memory cells 106a-106l. The programming signals may define a number of values to be applied to the memory cells 106a-106l. As described herein, the values of memory cells 106a-106l of crossbar array 105 may represent a weight matrix of a neural network, such as an HNN.

In continuing reference to FIG. 1A, hardware accelerator 100 may receive an input vector of node values at the plurality of row lines 104. The input vector may include node values which are to be evolved into next input values for the neural network. The input vector node values may be converted to input voltages by a drive circuit. A drive circuit (not shown) may deliver a set of input voltages that represents the input vector to the memristor crossbar array 105. In some examples, the voltages may be other forms of electrical stimulus such as an electrical current driven to the memory cells 106a-106l. Furthermore, in some examples, the input vector may include digital values, which may be converted to analog values of the input electrical signals by a digital-to-analog converter. In other examples, the input vector may already include analog values.

Upon passing through the memristor crossbar array 105, the plurality of column lines 107 may deliver output currents, where the output currents may be compared to a threshold current according to an update rule to generate a new input vector of new node values. According to the embodiments, a column that is eliminated in the HNN 150 as a result of regularized pruning can translate in the hardware design by turning "off" the corresponding column in the memristor crossbar array 105. In the example of FIG. 1A, column 115 and column 125 are shown as "off." Turning "off" column 115 and 125 may be implemented using a selector, for example, configured to act as an on-off switch. A selector (or other circuit element) can be coupled to each of the columns 107 in the memristor crossbar array 105 which facilitate targeting a particular column, such that a current flow is not admitted to the row (e.g., as depended on the voltage applied across the terminals). In reference to the example, during hardware deployment, a selector coupled to "pruned" column 115, and column 125 can selectively switch those columns "off," so as to prevent an electrical signal from being applied to the group of memory cells in those column (e.g., renders the column non-operable when the hardware accelerator 115 is powered on). Consequently, turning "off" column 115 would include switching "off" memory cells 106b, 106f, and 106j. Similarly, turning "off" column 125 would include switching "off" memory cells 106d, 106h, and 106l. Alternatively, any electrical device (or electrical signal modification approach) that may be used with memristor devices to provide the desirable electrical properties to implement turning "off" a column line in the memristor crossbar array 105 can be used, as deemed necessary and/or appropriate.

Hardware accelerator 115 may also include peripheral circuitry 130 associated with memristor crossbar array 105. As described in detail above, the hardware optimization process 100 can also selectively turn "off" certain electrical components included in the peripheral circuitry 130 that correspond to a pruned column. In FIG. 1A, peripheral circuitry 130 includes an amp 132b that is coupled to column line 115, forming a vertically-aligned grouping (forming a contiguous column) with the memory cells coupled to that column line 115, shown as memory cells 106b, 106f, and 106j. Additionally, amp 132d is coupled to the column line 125, forming a vertically-aligned grouping (forming a contiguous column) with the memory cells coupled to that column line 125, shown as memory cells 106d, 106h, and 106l. Thus, in accordance with the hardware optimization process 100, a selective pruning of columns 115 and 125 in the memristor crossbar array 105, also turns-off these amps 132b and 132d, and the related ADCs. Furthermore, the process 100 can selectively remove, or turn-off, other electrical components in the hardware accelerator 115 that may be implemented as a part of the peripheral circuitry 130 (not shown in the illustrated example of FIG. 1A), as deemed necessary, in order to emulate a neural network that has been subjected to regularized pruning as disclosed herein. Moreover, effectively removing an entire column of elements from the hardware design, including the more performance-per-area consuming peripheral circuitry 130 elements can result in significant enhancements to the performance-per-power and performance-per-area characteristics of the circuitry. As an example, an approximately 10-50% reduction in the number of columns may realize an 10-50% improvement in the performance-per-area (or performance-per-power) area of the circuit for the hardware accelerator 115, in accordance with the hardware optimization techniques described herein. Also, the disclosed hardware optimization techniques may reduce the overall IC area and cost for the hardware emulated neural networks, such as hardware accelerator 115.

Referring to now to FIG. 1B, another example of the hardware optimization process 100 that may be applied to hardware accelerator 115 is illustrated. In general, the process 100 in FIG. 1B is similar to the process shown in FIG. 1A. That is, adapting the circuitry to emulate the pruned neural network, in accordance with regularized pruning approach, can be performed during hardware deployment in both cases. For the purposes of brevity, elements illustrated for describing the optimization process 100 in FIG. 1A that are similar in function and/or design to corresponding elements in FIG. 1B are not discussed in detail again in reference to FIG. 1B. However, it should be appreciated that the hardware optimization process 100 depicted in FIG. 1B involves another example regularization function 145. The regularization function 145 can be employed to achieve regularized pruning (e.g., selectively reduce the number active columns), as described in greater detail.

For example, the regularization function 145 used by the optimization technique 100 in FIG. 1B includes a loss term (for the k-th column) the may be represented as the equation below:

$$L_k = \gamma \frac{1}{m} \Sigma_{i=1}^{m} (\Sigma_{j=1}^{n} w_{jk})^2 \qquad (3)$$

where $L_k$ is the loss term associated with the k-th layer;
$\gamma$ is the weighting factor specifying the contribution of this loss term to the total loss, it can be used to find balance between accuracy and number of neurons that do not propagate signal;
m is the number of examples in a mini-batch;
n is the number of neurons (columns);
$w_{jk}$ is the weight of the j-th neuron (column) in the k-th column.

While the regularization function used in FIG. 1A is tuned to minimize the outputs (e.g., $\gamma$) of the neural network, the regularization function 145 in FIG. 1B is configured to minimize the sum of the weights in each k-th column. Thus, regularization in the example of FIG. 1B involves each column adding the regularization term of equation (2). In some embodiments, regularized pruning of HNN 150 can involve using equation (2) instead of equation (1) during training. Also, in other embodiments, regularized pruning of HNN 150 can include applying equation (2) in addition to equation (1).

As described herein, there are three main operations that occur during operation of the hardware accelerator 115. The first operation is to program the memory cells 106a-106i in the memristor crossbar array 105 so as to map the mathematic values in an N×M weight matrix to the array. In some examples, N and M may be the same number, and the weight matrix is symmetrical. In some examples, each of the memory cells 106A-106l are programmed at a time during the programming operation. The second operation is to calculate an output current by the dot-product of input voltage and the resistance values of the memory cells of a column line 107. In this operation, input voltages are applied, and output currents obtained, corresponding to the result of multiplying an N×M matrix by an N×1 vector. In some examples, the input voltages are below the programming voltages so the resistance values of the memory cells 106a-106i, such as resistive memory, are not changed during the linear transformation calculation. The third operation is to compare the output currents with a threshold current. For example, comparators 120 may compare the output currents with the threshold current to determine a new input vector of new node values.

In an example, hardware accelerator 115 may calculate node values by applying a set of voltages simultaneously along row lines 104 of the N×M crossbar array 105 and collecting the currents through column lines 107 and generating new node values. On each column line 107, every input voltage 103 is weighted by the corresponding memristance ($1/G_{ij}$) and the weighted summation is reflected at the output current. Using Ohm's law, the relation between the input voltages 103 and the output currents can be represented by a vector-matrix multiplication of the form: $\{V^O\}T=-\{V^I\}^T[G] Rs$, where $G_{ij}$ is an N×M matrix determined by the conductance (inverse of resistance) of memristor crossbar array 105, Rs is the resistance value of the sense amplifiers and T denotes the transpose of the column vectors $V^O$ and $V^I$. The negative sign follows from use of a negative feedback operational amplifier in the sense amplifiers. From the foregoing, it follows that the hardware accelerator 115 can be utilized for multiplying a first vector of values $\{b_i\}^T$ by a matrix of values $[a_{ij}]$ to obtain a second vector of values $\{c_j\}^T$, where i=1,N and j=1,M. The vector operation can be set forth in more detail as follows:

$$a_{11}b_1+a_{21}b_2+\ldots+a_{N1}b_N=c_1$$

$$a_{1M}b_1+a_{2M}b_2+\ldots+a_{NM}b_N=c_M \qquad (4)$$

The vector processing or multiplication using the principles described herein generally starts by mapping a matrix of values $[a_{ij}]$ onto memristor crossbar array 105 or, stated otherwise, programming (e.g., writing) conductance values $G_{ij}$ into the crossbar junctions of the memristor crossbar array 105.

With reference still to FIG. 1B, in some examples, each of the conductance values $G_{ij}$ may be set by sequentially imposing a voltage drop over each of the memory cells 106A-106l. For example, the conductance value $G_{2,3}$ may be set by applying a voltage equal to $V_{Row2}$ at the second row line 104 of memristor crossbar array 105 and a voltage equal to $V_{Col3}$ at the third column line 107 of the array 105. The voltage input, $V_{Row2}$, may be applied to the second row line occurring at the second row line adjacent the j=1 column line. The voltage input, $V_{Col3}$, will be applied to the third column line adjacent either the i=1 or i=N location. Note that when applying a voltage at a column line 107, the sense circuitry for that column line may be switched out and a voltage driver switched in. The voltage difference $V_{Row2}-V_{Col3}$ will generally determine the resulting conductance value $G_{2,3}$ based on the characteristics of the memory cell 106f located at the intersection. When following this approach, the unselected column lines 107 and row lines 104 may be addressed according to one of several schemes, including, for example, floating all unselected column lines 107 and row lines 104 or grounding all unselected column lines and row lines. Other schemes involve grounding column lines 107 or grounding partial column lines 107. Grounding all unselected column lines and row lines is beneficial in that the scheme helps to isolate the unselected column lines and row lines to minimize the sneak path currents to the selected column line 107.

In accordance examples herein, memristors used in memory cells 106a-106l may have linear current-voltage relation. Linear current-voltage relations permit higher accuracy in the matrix multiplication process. However, memristor crossbar array 105 having linear memristors are prone to having large sneak path currents during programming of the array 105, particularly when the size of memristor crossbar array 105 is larger than a certain size, for instance, 32×32. In such cases, the current running through a selected memristor may not be sufficient to program the memristor because most of the current runs through the sneak paths. Alternatively, the memristor may be programmed at an inaccurate value because of the sneak paths.

To alleviate the sneak path currents in such instances, and especially when larger arrays are desired, an access device, such as an access transistor or a non-linear selector, may be incorporated within or utilized together with a memristor to minimize the sneak path currents in the array. More specifically, memory cell should be broadly interpreted to include memristive devices including, for example, a resistive memory element, a memristor, a memristor and transistor, or a memristor and other components.

Following programming, operation of hardware accelerator 115 proceeds by applying the input voltages 110 and comparing the output currents to threshold currents. The output current delivered from column lines 106 may be compared, by current comparator, with a threshold current. Current comparator (not shown) may be a circuit or device that compares two currents (i.e., output current and threshold current) and outputs a digital signal indicating which is larger. Current comparator may have two analog input terminals and one binary digital output. The comparator may determine a new node value for the emulated HNN. The new node values may be aggregated to generate a new input vector. For example, each output current may be compared by an update rule. A new node value corresponding to a particular output current can be set to a first value if the particular output current is greater than or equal to the threshold current, $\theta_i$. The new node value can be set to a second value if the particular output current is less than the threshold current. Each output current may be represented as the sum of the products of an input vector with the weight matrix. For example, the update rule may be represented as the equation that follows:

+1 if $\Sigma_j w_{ij} s_j \geq \theta_i$ $s_i$=−1 otherwise (5)

The node values may also be programmed to attain values of +1 or 0, rather than +1 and −1 in the above equation. Any other pair of values may also be used. In some examples, the threshold currents may be delivered to the current comparators 116 via circuitry independent from crossbar array 102. Furthermore, in some examples, column lines 107 may have different threshold currents associated with it. This is further described below. Alternatively, each column line 106 may be associated with a same threshold current.

Upon delivery of the new input vector of new node values, a controller may determine whether the new node values are final node values of the HNN. A neural network, for example, may be modeled to determine a minimum energy of a system. In such an example, a controller can determine whether the new node values, which here represents an energy of the system, are a local minimum of the system. In response to a controller determining that the new node values are not final node values, the new input vector can be converted to input voltages to be delivered to the plurality of row lines of the crossbar array 105. In such a manner, the hardware accelerator 100 can be recurrent to calculate an iterative problem, such as determining a minimum energy of a system, implementing an HNN as hardware.

In some cases, the hardware accelerator 115 can be implemented as an engine in a computing device. Example computing devices that include an example accelerator may be, for example, a personal computer, a cloud server, a local area network server, a web server, a mainframe, a mobile computing device, a notebook or desktop computer, a smart TV, a point-of-sale device, a wearable device, any other suitable electronic device, or a combination of devices, such as ones connected by a cloud or internet network, that perform the functions described herein.

FIGS. 2A-2B illustrate yet another example of a hardware optimization process 200, including regularized pruning of the emulated neural network. For purposes of brevity, the elements illustrated for describing the optimization process in FIGS. 1A-1B that are similar in function and/or design to corresponding elements in FIGS. 2A-2B are not discussed in detail again. For example, the elements shown regarding the regularized pruning techniques, which particularly employ equation (2) in FIG. 1A, are similarly illustrated as a part of process 200 in FIG. 2A. Also, the elements shown regarding there regularized pruning techniques, which particularly employ equation (3) in FIG. 1B, are similarly illustrated as included in process 200 of FIG. 2A. Moreover, the hardware accelerator 215 and crossbar array 205 depicted in FIGS. 2A-2B have substantially similar functions as the hardware accelerator and crossbar array that are described in detail in reference to FIGS. 1A-1B. However, it should be appreciated that the design of the hardware accelerator 215 and crossbar array 205 in FIGS. 2A-2B are provisioned with comparatively less circuitry than the hardware designs illustrated in FIGS. 1A-1B. For instance, the hardware accelerator 215 in FIG. 2A is provisioned with only one ADC 233 in its peripheral circuitry 230.

Additionally, crossbar array 205 includes a smaller number of columns. Only two column lines 207 are shown in the illustrated example. The hardware optimization process 200 in FIG. 2A can consider constraints of a current hardware design, such as the number of implemented columns lines 207 in the crossbar array 205 and/or the number of elements in the peripheral circuitry 230, as parameters with which to govern the regularized pruning. As an example, training the HNN 250 can be configured to enforce the requirement of emulating the HNN 250 on a crossbar array 205 having only two columns. The hardware constraints can be enforced by regularizing pruning, using the regularization function 240, to remove a number of weights in a manner that considers that a finite number of non-zero columns (e.g., output neurons) are included in the hardware implementation. Referring to the example of FIG. 2A, the regularization function can prune the HNN 250 such that two columns are allowed for emulation, which equals the known finite number of columns 207 that are present in the hardware design. In comparison to the hardware optimization techniques illustrated in FIGS. 1A-1B, the circuit for the hardware accelerator 215 is modified before the hardware deployment. In other words, the hardware accelerator 215 has an initial hardware design, which can include a substantially reduced IC area, that anticipates implementing an optimized HNN 150. By recognizing beforehand, that the HNN 150 to be emulated will be pruned using the regularized pruning aspect of the process 200, the circuitry can have a compact design that lends itself for optimization (e.g., performance-per-power and/or performance-per-area) to be a core design objective. As alluded to above, the hardware accelerator 215 can be designed to include a finite number of column lines 217 which is deemed appropriate for hardware optimization, for instance reducing the overall circuit area of the hardware accelerator 215. A hardware design for hardware accelerator 215 that is optimized pre-deployment specifically for pruned neural networks, is in contrast to many existing hardware emulated neural networks, that may use an overly robust and genericized hardware design.

In another example, a number of elements that are provisioned in the peripheral circuitry 230, for instance ADCs 233a, that are provisioned in the hardware accelerator 215 is less than a total number of columns 207 that are implemented. That is, the initial circuit design for the hardware accelerator 215 is created under the assumption that not all of the column lines 207 will be used, as regularized pruning aims to remove one or more columns that are associated with synaptic weights in the HNN 250. In this case, training the HNN 250 in accordance with process 200 can enforce the requirement of only one available ADCs 233a in the circuitry. Consequently, the regularization function 240 will prune the HNN 250 such that only the number of columns that can be properly implemented in conjunction with one ADC 233a in the peripheral circuitry 230, is allowed. The hardware optimization process 200, as depicted in FIGS. 2A-2B can leverage regularized pruning of a neural network to optimize the hardware design of the hardware accelerator 205 of the prior to its deployment, thereby saving power, reducing IC area, and reducing fabrication costs.

Figure 3:
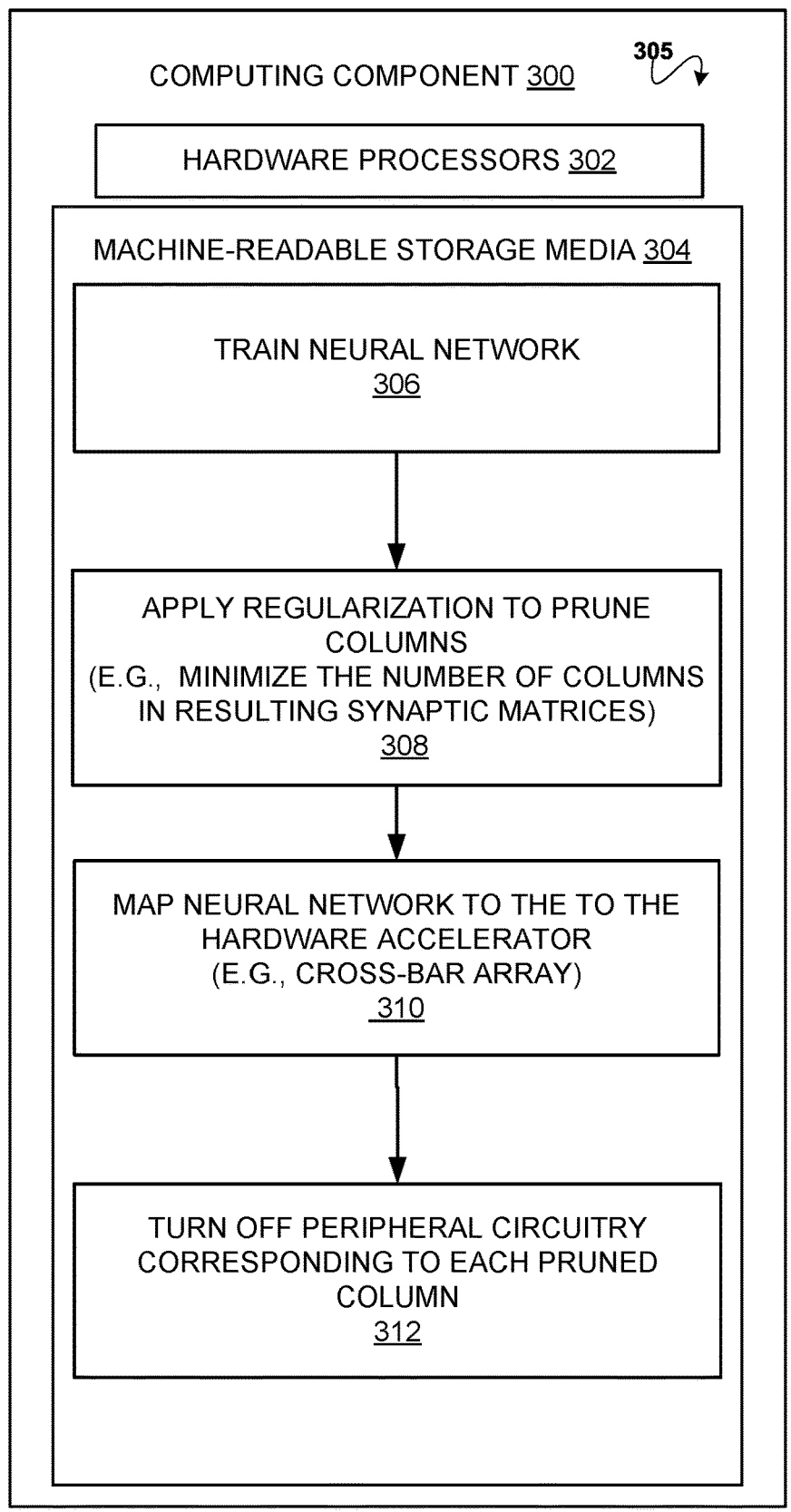
FIG. 3 is an operational flow diagram illustrating an example of a process for adapting a hardware accelerator during hardware deployment based on regularized pruning techniques, according to some embodiments.

FIG. 3 is an operational flow diagram illustrating an example of a process 305 relating to the hardware for emulating a neural network in accordance with the hardware optimization techniques described herein. In some cases, process 305 is performed in connection with the deployment (and use) of the hardware accelerator as shown in FIGS. 1A-1B for example. Furthermore, FIG. 3 shows process 305 as a series of executable operations stored on machine-readable storage media 304 and performed by hardware processor 302, which can be the main processor of a computer device including the disclosed hardware accelerator (including the circuitry therein). Processor 302 executes the operations of process 305, thereby implementing the disclosed techniques.

Process 305 begins at operation 306, by training a neural network. Training a neural network can include the functions described in greater detail in reference to FIGS. 1A-1B, for example. For the purposes of brevity, elements involved in training a neural network, such as an HNN, that are previously described are not discussed in detail again in reference to FIG. 3.

Next, at operation 308, a regularization function can be applied to training the neural network, thereby implementing the regularized pruning techniques disclosed herein. In some instances, operation 308 involves integrating the regularization function represented in equation (2) or equation (3) into training the neural network. In other cases, operation 308 can involve integrating the regularization function of equation (2) in addition with equation (3). Accordingly, the node values calculated during training are in accordance with the regularization of the neural network to selectively reduce the number of weights, for example removing synaptic weights. Furthermore, as previously discussed, pruning weights of the neural network can be emulated in the hardware by removing an entire weight column line from a crossbar array implementation. In some embodiments, operation 308 can involve iteratively stepping through each weight, or node, of the neural network and selecting whether the particular weight, and the corresponding column, is to be added or removed from the neural network.

Thereafter, the pruned neural network can be mapped to the crossbar array portion of the hardware accelerator operation, in operation 310. For example, a weight matrix may be converted to conductance values of a memristor crossbar array. The memristor crossbar array may be implemented using any of the circuit configurations described in detail in reference to FIGS. 1A-2B, for example. The weight matrix may represent a neural network that has been optimized (or accelerated) using regularized pruning. Furthermore, the weight matrix may be used for calculating values of nodes of the neural network. As described above, values stored in memory cells of the memristor crossbar array can represent the values of the weight matrix. In implementations or resistive memory, the resistance levels of each memory cell may represent the values of the weight matrix. In such a manner, the weight matrix may be mapped onto the memristor crossbar array. Furthermore, in accordance with the disclosed techniques, mapping the neural network to the crossbar array can involve selectively turning "off" one or more contiguous columns of memory cells that correspond to any pruned weights of the neural network. As described in detail above, turning "off" a column in the crossbar array may include causing a path to be less conductive, such that an electrical signal is not propagated through a particular column line (corresponding to the synaptic weight).

Subsequently, at operation 312, one or more elements of the peripheral circuitry that are coupled to a column that has been pruned, are also turned "off." In some cases, turning "off" the peripheral circuitry for pruned columns can include any electrical component that is in the same contiguous column with a turned "off" column in the crossbar array. Operation 312 may result in turning "off" components such as ADCs and current sensing amps that may not be used in operation of the hardware accelerator, due to pruning.

In some instances, operation 312 can involve re-routing of signals away from the peripheral circuitry that is coupled to a column that has been pruned. For example, an current signal that may otherwise be routed to an ADC of a pruned column, can be re-routed and directed towards sensing circuits of another column (e.g., turned "on" column line). In this case, a re-routed signal may be multiplexed with the other signals that are also propagating along the channel used for re-routing. Thus, by appropriately adapting the hardware design during deployment (e.g., consistent with regularized pruning of the emulated neural network) process 305 can achieve optimization of the hardware accelerator's circuitry. Accordingly, hardware optimization process 305 can realize several advantages related to an enhanced circuit design for the hardware accelerator, such as a reduced overall silicon area, and a reduced cost of deployment (e.g., optimal inclusion of expensive peripheral circuitry in the hardware accelerator).

Figure 4:
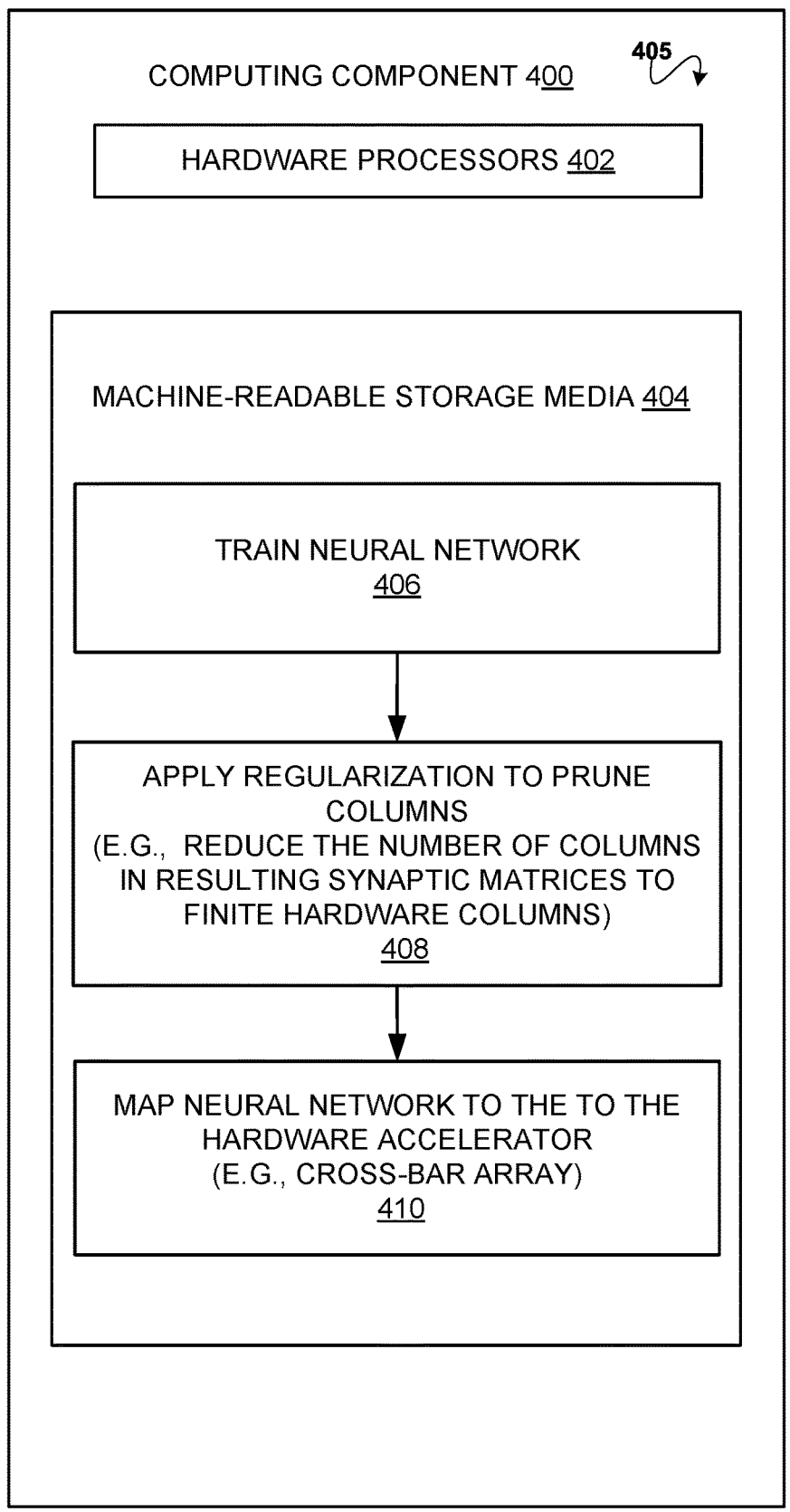
FIG. 4 is an operational flow diagram illustrating an example of a process for executing techniques for implementing a hardware accelerator system that has been adapted prior to hardware deployment based on regularized pruning techniques, according to some embodiments.

FIG. 4 is an operational flow diagram illustrating an example of a process 405 relating to the hardware for emulating a neural network in accordance with the hardware optimization techniques described herein. In some cases, process 405 is performed in connection with the deployment (and use) of the hardware accelerator. Furthermore, FIG. 4 shows process 405 as a series of executable operations stored on machine-readable storage media 404 and performed by hardware processor 402, which can be the main processor of a computer device including the disclosed hardware accelerator (including the circuitry therein). Processor 402 executes the operations of process 405, thereby implementing the disclosed techniques.

The process can begin at an operation 406, where the neural network is trained. Training a neural network can include the functions described in greater detail in reference to FIGS. 1A-1B, for example. For the purposes of brevity, elements involved in training a neural network, such as an HNN, that are previously described are not discussed in detail again in reference to FIG. 4.

Next, the process 405 can proceed to operation 408 in order to perform regularized pruning of the neural network. Regularized pruning of operation 408 can involve integrating the regularization function described in reference to FIGS. 2A-2B into the training of the neural network. A characteristic of the hardware optimization process 405, is that the regularization function can be configured to prune with respect to the specifications of a current hardware design for the hardware accelerator. It should be appreciated that the hardware design for the hardware accelerator, in the case of hardware optimization process 405, can be particularly adapted for optimization prior to deployment. As an example, the circuitry for a hardware accelerator may be initially designed to be optimized for enhanced performance-per-area (e.g., reduced peripheral circuitry and/or a smaller crossbar array). In accordance with the embodiments, hardware that has been optimization in this manner has certain design properties, such as having a reduced overall circuit area, which lends itself for emulating a regularized pruned neural network. Therefore, regularization of operation 308, in some cases, can prune the neural network such that the synaptic weights that are removed (or a total number of remaining weights) from the neural network is consistent with a known finite number of columns lines in the crossbar array of the circuitry (e.g. with respect to the current hardware design). In other cases, regularization at operation 408 can prune the neural network considering that the hardware design provisions less peripheral circuitry, for instance ADCs, than needed for the total number of column lines in the crossbar array of the circuitry (e.g. with respect to the current hardware design). Therefore, operation 408 can include enforcing a hardware-specific requirement of the current hardware design. Restated, by using regularized pruning of the neural network to remove synaptic weights in a systematic manner, its emulation can be mapped to the known finite number (non-zero) of columns, or a total number of available peripheral circuitry elements, that are implemented by the hardware.

In some instances, operation 408 involves integrating the regularization function represented in equation (2) or equation (3) into training the neural network. In other cases, operation 308 can involve integrating the regularization function of equation (2) in addition with equation (3). Accordingly, the node values calculated during training are in accordance with the regularization of the neural network to selectively reduce the number of weights, for example removing synaptic weights. Furthermore, as previously discussed, pruning weights of the neural network can be emulated in the hardware by removing an entire weight column line from a crossbar array implementation. In some embodiments, operation 408 can involve iteratively stepping through each weight, or node, of the neural network and selecting whether the particular weight, and the corresponding column, is to be added or removed from the neural network.

Subsequently, the pruned neural network can be mapped to the memristor crossbar array portion of the hardware accelerator operation, in operation 410. As alluded to above, process 405 can include optimizing the hardware accelerator's design prior to its deployment, which enables a further optimized neural network (i.e., by applying regularized pruning as disclosed herein) to be effectively mapped thereto. According to the embodiments, hardware optimization process 405 can increase the performance of the hardware accelerator, and further reduce the costs of deployment.

Figure 5:
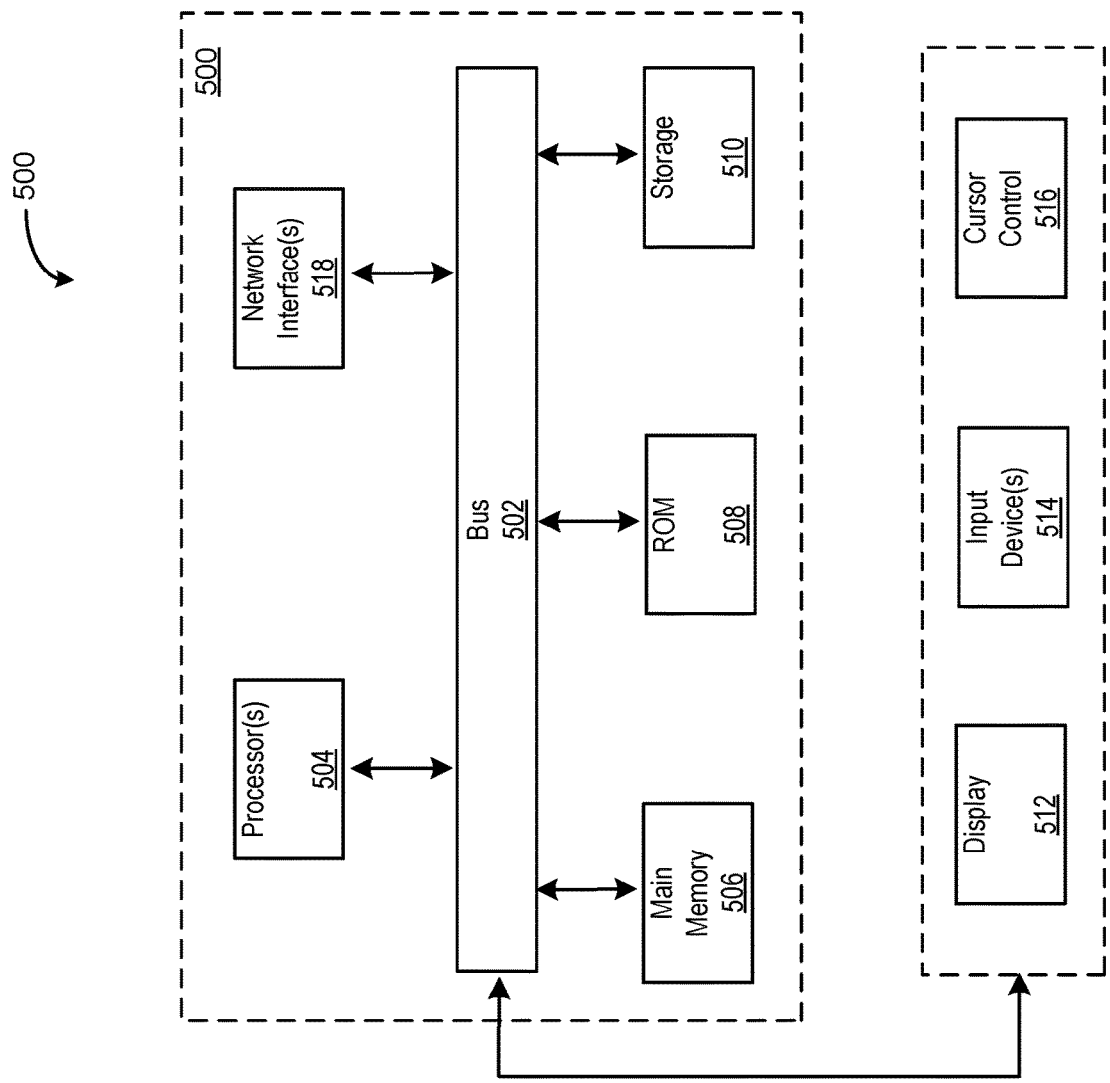
FIG. 5 illustrates an example computer system that may include the hardware accelerator emulating a neural network shown in FIGS. 1A-1B, according to some embodiments.

FIG. 5 depicts a block diagram of an example computer system 500 in which the hardware accelerator and/or the optimization techniques of the embodiments described herein may be implemented. The computer system 500 includes a bus 502 or other communication mechanism for communicating information, and one or more hardware processors 504 coupled with bus 502 for processing information. Hardware processor(s) 504 may be, for example, one or more general purpose microprocessors.

The computer system 500 also includes a main memory 506, such as a random-access memory (RAM), cache and/or other dynamic storage devices, coupled to bus 502 for storing information and instructions to be executed by processor 504. Main memory 506 also may be used for storing temporary variables or other intermediate information during execution of instructions to be executed by processor 504. Such instructions, when stored in storage media accessible to processor 504, render computer system 500 into a special-purpose machine that is customized to perform the operations specified in the instructions. The description of the functionality provided by the different instructions described herein is for illustrative purposes, and is not intended to be limiting, as any of instructions may provide more or less functionality than is described. For example, one or more of the instructions may be eliminated, and some or all of its functionality may be provided by other ones of the instructions. As another example, processor 504 may be programmed by one or more additional instructions that may perform some or all of the functionality attributed herein to one of the instructions.

The computer system 500 further includes storage device 510. The various instructions described herein, including the ADC list concatenation techniques, may be stored in a storage device 510, which may comprise read only memory (ROM), and/or other static storage device coupled to bus 502 for storing static information and instructions for processor 504. A storage device 510, such as a magnetic disk, optical disk, or USB thumb drive (Flash drive), etc., is provided and coupled to bus 502 for storing information and instructions. The storage device 510 may store the computer program instructions (e.g., the aforementioned instructions) to be executed by processor 504 as well as data that may be manipulated by processor 504. The storage device may comprise one or more non-transitory machine-readable storage media such as floppy disks, hard disks, optical disks, tapes, or other physical storage media for storing computer-executable instructions and/or data.

The computer system 500 may be coupled via bus 502 to a display 512, such as a liquid crystal display (LCD) (or touch screen), for displaying information to a computer user. An input device 514, including alphanumeric and other keys, is coupled to bus 502 for communicating information and command selections to processor 504. Another type of user input device is cursor control 616, such as a mouse, a trackball, or cursor direction keys for communicating direction information and command selections to processor 504 and for controlling cursor movement on display 512. In some embodiments, the same direction information and command selections as cursor control may be implemented via receiving touches on a touch screen without a cursor.

The computing system 500 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "component," "engine," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

The computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to processor(s) 504 executing one or more sequences of one or more instructions contained in main memory 508. Such instructions may be read into main memory 508 from another storage medium, such as storage device 510. Execution of the sequences of instructions contained in main memory 508 causes processor(s) 504 to perform the process steps described herein. In alternative embodiments, hard-wired circuitry may be used in place of or in combination with software instructions.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto, such as computer system 500.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A hardware accelerator, comprising:
   a crossbar array programmed to calculate node values of a neural network, selectively determine pruned weights that are eliminated from a weight matrix, and determine pruned weight column lines from a plurality of weight columns lines that correspond to each of the determined pruned weights, wherein the node values are calculated in accordance with regularization of the neural network to selectively reduce the number of weights and a number of weight column lines, the crossbar array comprising:
      a plurality of weight row lines;
      the plurality of weight column lines; and
      a plurality of memory cells, each of the plurality of memory cells being coupled across an intersection of one of the plurality of weight row lines and one of the plurality of weight column lines, and each of the plurality of memory cells being programmed according to the weight matrix to output a calculated node value of the neural network across each of the plurality of weight column lines; and
   a plurality of periphery circuitry elements, wherein each of the plurality of periphery circuitry elements corresponds to a respective column line of the plurality of column lines.

2. The hardware accelerator of claim 1, wherein the hardware accelerator is programmed to power off the determined pruned weight column lines.

3. The hardware accelerator of claim 2, wherein the crossbar array is programmed to selectively determine weights that are included in the weight matrix, and determine included weight column lines from the plurality of weight columns lines that correspond to each of the determined included weights.

4. The hardware accelerator of claim 1, wherein the hardware accelerator is programmed to power off each periphery circuitry element that corresponds to each of the respective pruned weight column lines.

5. The hardware accelerator of claim 4, wherein the hardware accelerator is programmed to power off each of the periphery circuit elements by forming a less conductive path for an electrical signal for each of the respective pruned weight column lines such that a power consumption associated with the hardware accelerator is reduced.

6. The hardware accelerator of claim 5, wherein each of the memory cells comprise a memristor.

7. The hardware accelerator of claim 4, wherein the hardware accelerator is programmed to power off each of the periphery circuit elements by re-routing an electrical signal from each of the respective pruned weight columns lines such that a power consumption associated with the hardware accelerator is reduced.

8. The hardware accelerator of claim 1, wherein the crossbar array is programmed to calculate the node values in accordance with regularization of the neural network by integrating a regularization function into training the neural network.

9. A hardware accelerator, comprising:
 a crossbar array programmed to calculate node values of a neural network, selectively determine pruned weights that are eliminated from a weight matrix, and determine pruned weight column lines from a plurality of weight columns lines that correspond to each of the determined pruned weights, wherein the node values are calculated in accordance with regularization of the neural network to selectively reduce the number of weights, the crossbar array comprising:
  a plurality of weight row lines;
  the plurality of weight column lines, wherein the plurality of weight columns is a finite number of weight column lines; and
  a plurality of memory cells, each of the plurality of memory cells being coupled across an intersection of one of the plurality of weight row lines and one of the plurality of weight column lines, and each of the plurality of memory cells being programmed according to the weight matrix to output a calculated node value of the neural network across each of the plurality of weight column lines; and
 a plurality of periphery circuitry elements, wherein each of the plurality of periphery circuitry elements corresponds to a respective column line of the plurality of column lines.

10. The hardware accelerator of claim 9, wherein the crossbar array is programmed to calculate the node values in accordance with regularization of the neural network to selectively reduce the number of weights to enforce the finite number of weight column lines for the crossbar array by integrating a regularization function into training the neural network.

11. The hardware accelerator of claim 10, wherein the finite number of weight column lines for the crossbar array adapts the crossbar array such that a circuit area associated with the hardware accelerator is reduced.

* * * * *